(12) United States Patent
Cho et al.

(10) Patent No.: US 8,916,402 B2
(45) Date of Patent: Dec. 23, 2014

(54) SEMICONDUCTOR LIGHT EMITTING DEVICE INCLUDING SUBSTRATE HAVING PROTECTION LAYERS PROVIDING PROTECTION AGAINST CHEMICALS AND METHOD FOR MANUFACTURING THE SAME

(75) Inventors: Myong Soo Cho, Seoul (KR); Ki Yeol Park, Gyeonggi-do (KR); Pun Jae Choi, Gyeonggi-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 115 days.

(21) Appl. No.: 13/460,486

(22) Filed: Apr. 30, 2012

(65) Prior Publication Data
US 2012/0211795 A1    Aug. 23, 2012

Related U.S. Application Data

(62) Division of application No. 12/418,149, filed on Apr. 3, 2009.

(30) Foreign Application Priority Data

Nov. 6, 2008  (KR) .................. 10-2008-0109792
Feb. 27, 2009  (KR) .................. 10-2009-0016947

(51) Int. Cl.
  *H01L 21/00*    (2006.01)
  *H01L 33/00*    (2010.01)
  *H01L 33/40*    (2010.01)
  *H01L 33/38*    (2010.01)

(52) U.S. Cl.
  CPC ........... *H01L 33/0079* (2013.01); *H01L 33/405* (2013.01); *H01L 33/38* (2013.01)
  USPC .............................................. 438/33; 438/27

(58) Field of Classification Search
CPC combination set(s) only.
See application file for complete search history.

(56) References Cited

U.S. PATENT DOCUMENTS

| 6,786,390 | B2 | 9/2004 | Yang et al. |
| 8,383,438 | B2 * | 2/2013 | Xiong et al. .................... 438/39 |
| 2001/0026950 | A1 | 10/2001 | Sunakawa et al. |
| 2004/0061433 | A1 | 4/2004 | Izuno et al. |

(Continued)

FOREIGN PATENT DOCUMENTS

| CN | WO2010/020069 | * | 2/2010 | ............. H01L 21/00 |
| JP | 63-160292 A | | 7/1988 | |

(Continued)

OTHER PUBLICATIONS

Japanese Office Action, with English translation, issued in Japanese Patent Application No. 2009-099981, dated Dec. 20, 2011.

(Continued)

*Primary Examiner* — Bilkis Jahan
(74) *Attorney, Agent, or Firm* — McDermott Will & Emery LLP

(57) ABSTRACT

The present invention provides a compound semiconductor light emitting device including: an Si—Al substrate; protection layers formed on top and bottom surfaces of the Si—Al substrate; and a p-type semiconductor layer, an active layer, and an n-type semiconductor layer which are sequentially stacked on the protection layer formed on the top surface of the Si—Al substrate, and a method for manufacturing the same.

12 Claims, 8 Drawing Sheets

(56) References Cited

U.S. PATENT DOCUMENTS

| | | |
|---|---|---|
| 2004/0072383 A1* | 4/2004 | Nagahama et al. ............ 438/47 |
| 2006/0202614 A1* | 9/2006 | Li ................................ 313/506 |
| 2006/0268955 A1* | 11/2006 | Cho et al. ................. 372/50.124 |
| 2007/0046192 A1* | 3/2007 | Akai et al. .................... 313/506 |
| 2008/0135859 A1 | 6/2008 | Cho et al. |
| 2008/0230792 A1 | 9/2008 | Jiang et al. |
| 2009/0026473 A1 | 1/2009 | Jiang et al. |
| 2009/0166663 A1 | 7/2009 | Sakai |
| 2009/0267048 A1 | 10/2009 | Nakahara |

FOREIGN PATENT DOCUMENTS

| | | |
|---|---|---|
| JP | 03-284886 A | 12/1991 |
| JP | 2001-284314 A | 10/2001 |
| JP | 2002-016286 A | 1/2002 |
| JP | 2005-347714 A | 12/2005 |
| JP | 2006-324685 A | 11/2006 |
| JP | 2006-332649 A | 12/2006 |
| JP | 2007-019488 A | 1/2007 |
| JP | 2007-207869 A | 8/2007 |
| JP | 2007-220902 A | 8/2007 |
| JP | 2007-287757 A | 11/2007 |
| JP | 2008-135789 A | 6/2008 |
| JP | 2008-147672 A | 6/2008 |
| JP | 2008-227395 A | 9/2008 |
| WO | WO 2006/125396 A1 | 11/2006 |
| WO | WO 2007/048345 A1 | 5/2007 |
| WO | WO 2007/096405 A1 | 8/2007 |
| WO | WO 2007/123355 A1 | 11/2007 |

OTHER PUBLICATIONS

German Office Action issued in German Application No. 10 2009 017 148.7 dated Jun. 24, 2014, w/English abstract.

* cited by examiner

SEMICONDUCTOR LIGHT EMITTING DEVICE INCLUDING SUBSTRATE HAVING PROTECTION LAYERS PROVIDING PROTECTION AGAINST CHEMICALS AND METHOD FOR MANUFACTURING THE SAME

CROSS-REFERENCE TO RELATED APPLICATIONS

This application is a Divisional of U.S. application Ser. No. 12/418,149, filed on Apr. 3, 2009, which claims the benefit of Korean Patent Application No. 10-2008-0109792 and 10-2009-0016947 filed with the Korea Intellectual Property Office on Nov. 6, 2008 and Feb. 27, 2009, the disclosures of which are incorporated herein by reference.

BACKGROUND OF THE INVENTION

1. Field of the Invention

The present invention relates to a compound semiconductor light emitting device and a method for manufacturing the same; and, more particularly, to a compound semiconductor light emitting device including a protection layer on the surface of a Si—Al substrate, and a method for manufacturing the same.

2. Description of the Related Art

A GaN-based semiconductor, which is expressed as $Al_xGa_yIn_{(1-x-y)}N(0 \leq x \leq 1, 0 \leq y \leq 1, 0 \leq x+y \leq 1)$, has been used for a blue or green LED(Light Emitting Diode) as a compound semiconductor appropriate for light emission in blue and ultraviolet regions. A generally used GaN-based LED includes an n-type GaN-based semiconductor layer, an active layer, a p-type GaN-based semiconductor layer and two electrodes(n-side electrode and p-side electrode) which are sequentially grown on a sapphire substrate. Since the sapphire substrate used as a growth substrate is made of insulating material, the two electrodes are horizontally arranged.

Since in the GaN-based LED having such a horizontal structure, both of the two electrodes are positioned at an upper part of the LED, the LED should have a wide area. In addition, a transparent electrode for current spreading and the n-side electrode are disposed close to each other, which makes the LED vulnerable to defect caused by static electricity.

Instead of the GaN-based LED with the horizontal structure having the disadvantage, a vertical GaN-based LED is recently used which uses a conductive SiC substrate as a growth substrate of a GaN-based semiconductor. However, this has a disadvantage in that the high-cost SiC substrate is used.

Another vertical GaN-based LED is manufactured through a bonding process of a conductive substrate and a separation process of a sapphire substrate. For example, Korean Patent Laid-open Publication No. 10-2004-0058479 discloses a vertical GaN-based LED including a conductive substrate such as an Si substrate bonded to a GaN-based semiconductor layer by a conductive adhesion layer.

However, in the case of the conventional vertical GaN-based LED manufactured through the bonding process of the conductive substrate such as the Si substrate and the separation process of the sapphire substrate, there is caused a defect such as a crack in the GaN-based semiconductor layer when separating the sapphire substrate through laser irradiation. This is because CTE(Coefficient of Thermal Expansion)(approximately 2.6 ppm/K) of Si that is material of the conductive substrate is much lower than CTE(6 to 7 ppm/K) of the sapphire substrate.

More specifically, if the conductive substrate made of Si is bonded to the GaN-based semiconductor layer at a temperature of approximately 200 to 400° C. and then cooled at a room temperature, the conductive substrate contracts slightly, while the sapphire substrate contracts considerably. As a result, a large tensile stress is applied to the sapphire substrate to thereby warp the conductive substrate and the sapphire substrate. If the sapphire substrate is separated through laser irradiation in a warped state due to the tensile stress, mechanical impact is applied to an interface between the sapphire substrate and the GaN-based semiconductor layer to thereby cause a lot of cracks in the GaN-based semiconductor layer.

Therefore, an Si—Al substrate having a similar CTE to that of the sapphire substrate is recently used instead of the Si substrate as the conductive substrate, thereby obtaining a high-quality vertical semiconductor light emitting device which reduces the generation of crack.

However, in the case when the Si—Al substrate is used, Al of the Si—Al substrate is easily etched due to attack of chemicals such as acid and alkali used in a process of manufacturing a light emitting device to thereby generate severe unevenness on the surface of the Si—Al substrate, which causes an error that the GaN-based semiconductor layer is peeling off which is bonded to the Si—Al substrate.

SUMMARY OF THE INVENTION

The present invention has been proposed in order to overcome the above-described problems and it is, therefore, an object of the present invention to provide a compound semiconductor light emitting device capable of preventing Al of an Si—Al substrate from being etched due to chemicals by additionally forming a protection layer on the surface of the Si—Al substrate to prevent the attack of chemicals such as acid and alkali, and a method for manufacturing the same.

Further, another object of the present invention is to provide a compound semiconductor light emitting device capable of improving surface roughness of an Si—Al substrate, and a method for manufacturing the same.

In accordance with one aspect of the present invention to achieve the object, there is provided a compound semiconductor light emitting device including: an Si—Al substrate; protection layers formed on top and bottom surfaces of the Si—Al substrate; and a p-type semiconductor layer, an active layer, and an n-type semiconductor layer which are sequentially stacked on the protection layer formed on the top surface of the Si—Al substrate.

Herein, the protection layer may be formed of metal or conductive dielectric.

Further, the metal may be formed of any one selected from a group consisting of Ni, Au, Cu, W, Cr, Mo, Pt, Ru, Rh, Ti, and Ta, or an alloy of two or more selected from the group.

Further, the conductive dielectric may be formed of any one selected from a group consisting of ITO(Indium Tin Oxide), IZO(Indium Zinc Oxide), and CIO(Copper Indium Oxide).

Further, the protection layer may be formed at a thickness of 0.01 μm or more and 20 μm or less.

Further, the compound semiconductor light emitting device includes a bonding metal layer formed between the protection layer formed on the top surface of the Si—Al substrate and the p-type semiconductor layer.

Further, the compound semiconductor light emitting device includes a reflective metal layer formed between the bonding metal layer and the p-type semiconductor layer.

In accordance with another aspect of the present invention to achieve the object, there is provided a method for manufacturing a compound semiconductor light emitting device including the steps of: sequentially forming an n-type semiconductor layer, an active layer, and a p-type semiconductor layer on a growth substrate; preparing an Si—Al substrate formed including a protection layer on the surface; bonding the Si—Al substrate including the protection layer on the surface to the p-type semiconductor layer; separating the growth substrate from the n-type semiconductor layer; forming a plurality of n-side electrodes on the n-type semiconductor layer; and dicing the n-type semiconductor layer, the active layer, the p-type semiconductor layer, the protection layer, and the Si—Al substrate between the n-side electrodes to be divided into chip units.

Further, the protection layer may be formed by using metal or conductive dielectric in the step of preparing the Si—Al substrate including the protection layer on the surface.

Further, in the case when the protection layer is formed of the metal, the metal may be formed by any one of electroless plating, metal deposition, sputtering and CVD(Chemical Vapor Deposition).

Further, in the case when the protection layer is formed of the conductive dielectric, the conductive dielectric may be formed by deposition or sputtering.

Further, the protection layer may be formed on the surface of the Si—Al substrate at a thickness of 0.01 µm or more and 20 µm or less.

Further, the method includes a step of: performing CMP (Chemical Mechanical Polishing) on the surface of the protection layer after the step of preparing the Si—Al substrate including the protection layer on the surface.

Further, the step of bonding the Si—Al substrate including the protection layer on the surface may be performed by directly bonding the Si—Al substrate including the protection layer on the surface to the p-type semiconductor layer.

Further, the step of bonding the Si—Al substrate including the protection layer on the surface may be performed by bonding the Si—Al substrate including the protection layer on the surface to the p-type semiconductor layer by using a bonding metal layer.

Further, the method includes a step of: forming a reflective metal layer on the p-type semiconductor layer after the step of forming the p-type semiconductor layer.

In accordance with still another aspect of the present invention to achieve the object, there is provided a compound semiconductor light emitting device including: an Si—Al substrate; a protection layer formed on a top surface of the Si—Al substrate to expose a portion of the Si—Al substrate; a conductive layer formed on the top surface of the Si—Al substrate including the protection layer; a p-type semiconductor layer, an active layer, and an n-type semiconductor layer which are sequentially stacked on the conductive layer; and a contact metal layer formed on a bottom surface of the Si—Al substrate.

Herein, the protection layer may be formed of an insulator.

In accordance with still another aspect of the present invention to achieve the object, there is provided a method for manufacturing a compound semiconductor light emitting device including the steps of: sequentially forming an n-type semiconductor layer, an active layer, and a p-type semiconductor layer on a growth substrate; preparing an Si—Al substrate including a protection layer on the other portions except for some portions of a top surface; forming a conductive layer on the top surface of the Si—Al substrate including the protection layer; bonding the conductive layer formed on the top surface of the Si—Al substrate to the p-type semiconductor layer; separating the growth substrate from the n-type semiconductor layer; forming a plurality of n-side electrodes on the n-type semiconductor layer; lapping a bottom surface of the Si—Al substrate including the protection layer; forming a contact metal layer on the bottom surface of the Si—Al substrate; and dicing the n-type semiconductor layer, the active layer, the p-type semiconductor layer, the conductive layer, the protection layer, the Si—Al substrate, and the contact metal layer between the n-side electrodes to be divided into chip units.

Herein, the step of preparing the Si—Al substrate including the protection layer on the other portions except for the some portions of the top surface includes steps of: forming the protection layer on the entire surface of the Si—Al substrate; and exposing the some portions of the top surface of the Si—Al substrate by removing a portion of the protection layer.

Further, the protection layer may be formed by using an insulator in the step of forming the protection layer on the entire surface of the Si—Al substrate.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

Figure 1:
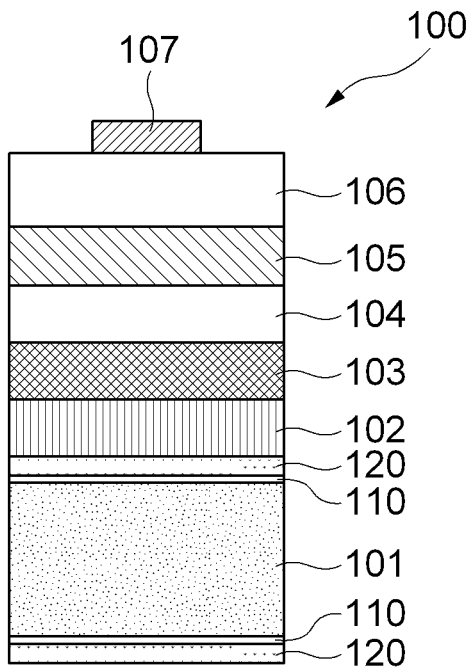
FIG. 1 is a cross-sectional view showing a structure of a compound semiconductor light emitting device in accordance with a first embodiment of the present invention.

Embodiments of a compound semiconductor light emitting device and a method for manufacturing the same in accordance with the present invention will be described in detail with reference to the accompanying drawings. When describing them with reference to the drawings, the same or corresponding component is represented by the same reference numeral and repeated description thereof will be omitted.

<First Embodiment>

Structure of a Compound Semiconductor Light Emitting Device in Accordance with a First Embodiment A compound semiconductor light emitting device in accordance with a first embodiment of the present invention will be described in detail with reference to FIG. 1.

FIG. 1 is a cross-sectional view showing a structure of a compound semiconductor light emitting device in accordance with the first embodiment of the present invention.

As shown in FIG. 1, the compound semiconductor light emitting device 100 in accordance with the first embodiment of the present invention includes a substrate formed of an alloy of Si and Al(hereinafter referred to as 'Si—Al substrate') 101 and protective layers 120 formed on a top surface and a bottom surface of the Si—Al substrate 101.

On the protective layer 120 formed on the top surface of the Si—Al substrate 101, there are sequentially stacked a bonding metal layer 102, a reflective metal layer 103, a p-type semiconductor layer 104, an active layer 105, and an n-type semiconductor layer 106.

The p-type and n-type semiconductor layers 104 and 106 and the active layer 105 may be formed of a GaN-based semiconductor, i.e. $Al_xGa_yIn_{(1-x-y)}N(0 \leq x \leq 1, 0 \leq y \leq 1, 0 \leq x+y \leq 1)$ semiconductor material, or the like, and constitute a light emitting structure. An n-side electrode 107 is formed on the n-type semiconductor layer 106.

The reflective metal layer 103 interposed between the bonding metal layer 102 and the p-type semiconductor layer 104 reflects light impinged from the semiconductor layer upward to thereby further increase brightness of the compound semiconductor light emitting device 100.

The reflective metal layer 103 may be formed of metal with high reflectivity, e.g., metal selected from a group consisting of Au, Ag, Al, Rh, and an alloy of two or more among them. However, the reflective metal layer 103 may not be formed if necessary.

The bonding metal layer 102 bonds the Si—Al substrate 101 to the light emitting structure. As for the bonding metal layer 102, Au or the like may be used.

Herein, although the compound semiconductor light emitting device 100 of the first embodiment of the present invention includes the bonding metal layer 102, the Si—Al substrate 101 may be directly bonded to the p-type semiconductor layer 104 without the bonding metal layer 102.

Further, the compound semiconductor light emitting device 100 in accordance with the first embodiment of the present invention uses the Si—Al substrate 101 as a conductive substrate as mentioned above. The Si—Al substrate has advantages in terms of CTE(Coefficient of Thermal Expansion), thermal conductivity, mechanical processing, and cost.

Figure 2:
FIGS. 2 to 9 are cross-sectional views sequentially illustrating processes of a method for manufacturing a compound semiconductor light emitting device in accordance with the first embodiment of the present invention.

In other words, the CTE of the Si—Al substrate 101 is similar to that(approximately 6 to 7 ppm/K) of the sapphire substrate(see '150' of FIG. 2). Therefore, in the case when the compound semiconductor light emitting device 100 is manufactured by using the Si—Al substrate 101, it is possible to remarkably reduce warpage of the substrate and cracks of the light emitting structure which are caused during the bonding process of the conventional conductive substrate formed of Si and during the separation process of the sapphire substrate through laser irradiation, thereby obtaining the high-quality compound semiconductor light emitting device 100 which reduces the defects.

In addition, since the Si—Al substrate 101 has the thermal conductivity of approximately 120 to 180 W/m·K, it has an excellent heat discharge characteristic. Moreover, since the Si—Al substrate 101 can be easily manufactured by melting Si and Al at high pressure, it is possible to easily obtain the Si—Al substrate 101 at a low cost.

Particularly, in the compound semiconductor light emitting device 100 in accordance with the first embodiment of the present invention, the protection layers 120 are additionally formed on the top and bottom surfaces of the Si—Al substrate 101 to prevent chemical attack on the Si—Al substrate 101.

Herein, the protection layers 120 may be formed of metal, conductive dielectric, or the like. At this time, in the case when the protection layers 120 are formed of metal, the metal may be formed of any one selected from a group consisting of Ni, Au, Cu, W, Cr, Mo, Pt, Ru, Rh, Ti, and Ta, or an alloy of two or more selected from the group.

Further, in the case when the protection layers 120 are formed of conductive dielectric, the conductive dielectric may be formed of ITO(Indium Tin Oxide), IZO(Indium Zinc Oxide), CIO(Copper Indium Oxide), or the like.

In case when the protection layers 120 are formed of metal, the protection layers may be formed by an electroless plating method. At this time, seed metal layers 110 may be further formed between the Si—Al substrate 101 and the protection layers 120 formed of metal to play a role of seeds in a plating process of the protection layers 120. The seed metal layers 110 may be formed of Ti/Au or the like.

Herein, the protection layers 120 formed of the metal may be formed by a method such as metal deposition, sputtering, or CVD(Chemical Vapor Deposition) other than the electroless plating method as described above.

Further, in the case when the protection layers 120 are formed of the conductive dielectric, the protection layers 120 formed of the conductive dielectric may be formed by a method such as deposition or sputtering.

It is preferable that the protection layers 120 are formed at thicknesses of 0.01 μm or more and 20 μm or less and more preferably, they are formed at thicknesses of 1 μm or more and 10 μm or less.

Method for Manufacturing a Compound Semiconductor Light Emitting Device in Accordance with the First Embodiment Hereinafter, a method for manufacturing a compound semiconductor light emitting device in accordance with the first embodiment of the present invention will be described in detail with reference to FIGS. 2 to 9.

FIGS. 2 to 9 are cross-sectional views sequentially illustrating processes of a method for manufacturing a compound semiconductor light emitting device in accordance with the first embodiment of the present invention.

Figure 3:
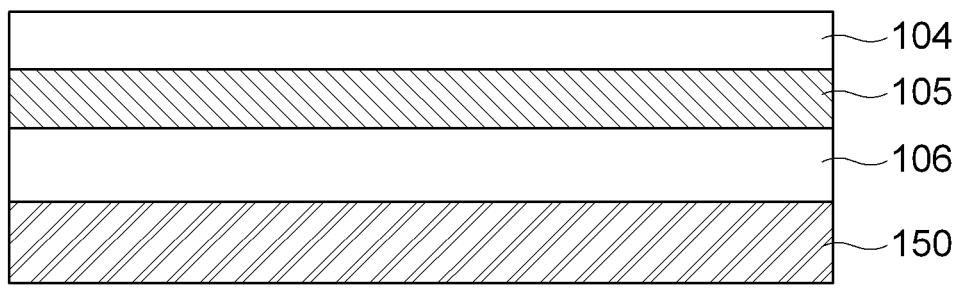

First, as shown in FIG. 2, after preparing a sapphire substrate 150 as a growth substrate, as shown in FIG. 3, an n-type semiconductor layer 106, an active layer 105, and a p-type semiconductor layer 104 are sequentially formed on the sapphire substrate 150.

Figure 4:
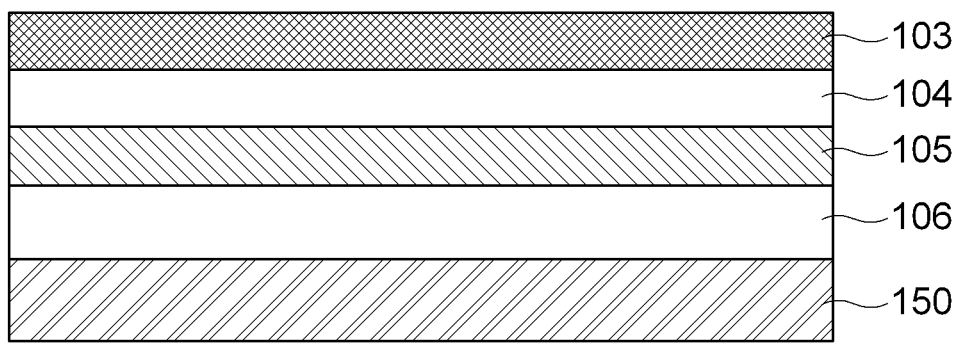

Thereafter, as shown in FIG. 4, a reflective metal layer 103 is formed on the p-type semiconductor layer 104 by using metal material with high reflectivity, e.g., Au, Al, Ag, or Rh. Herein, the reflective metal layer 103 may not be formed if necessary.

Figure 5:
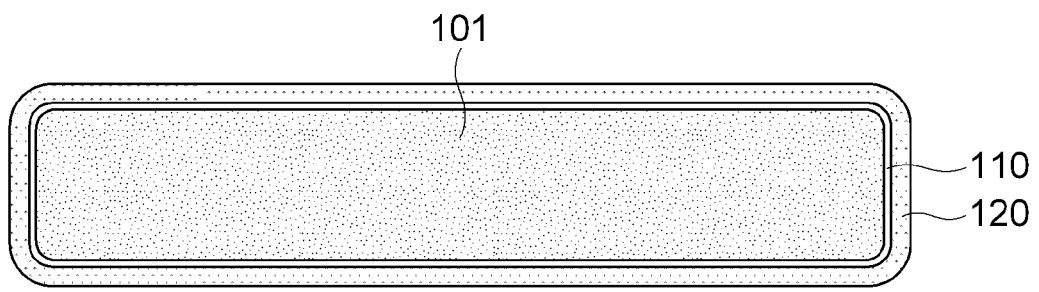

Thereafter, as shown in FIG. 5, a protection layer 120 is formed on the surface of an Si—Al substrate 101. The protection layer 120 may be formed by using metal or conductive dielectric.

Herein, in the case when the protection layer 120 is formed of metal, the protection layer 120 may be formed of any one selected from a group consisting of Ni, Au, Cu, W, Cr, Mo, Pt, Ru, Rh, Ti, and Ta, or an alloy of two or more selected from the group by a method such as electroless plating, metal deposition, sputtering, or CVD(Chemical Vapor Deposition).

At this time, in the case when the protection layer 120 formed of the metal is formed by the electroless plating, a seed metal layer 110 may be additionally formed to play a role of a seed in a plating process of the protection layer 120 before forming the protection layer 120 on the surface of the Si—Al substrate 101.

Further, in the case when the protection layer 120 is formed of the conductive dielectric, the protection layer 120 may be formed of ITO(Indium Tin Oxide), IZO(Indium Zinc Oxide), CIO(Copper Indium Oxide), or the like by a method such as deposition or sputtering.

It is preferable that the protection layer 120 is formed on the entire surface of the Si—Al substrate 101 at a thickness of 0.01 μm or more and 20 μm or less and more preferably, it is formed at a thickness of 1 μm or more and 10 μm or less.

In the case when the protection layer 120 is formed at a thickness below 0.01 μm, the protection layer 120 can not satisfactorily suppress the attack of chemicals such as HCl, HF and KOH which are described below and in the case when it is formed at a thickness above 20 μm, CTE of the Si—Al substrate 101 may change. Therefore, it is preferable that the protection layer 120 is formed at the thickness within the above-mentioned range.

At this time, although not shown in the drawings, after forming the protection layer 120, surface roughness can be improved by performing CMP(Chemical Mechanical Polishing) on the surface of the protection layer 120.

Figure 6:
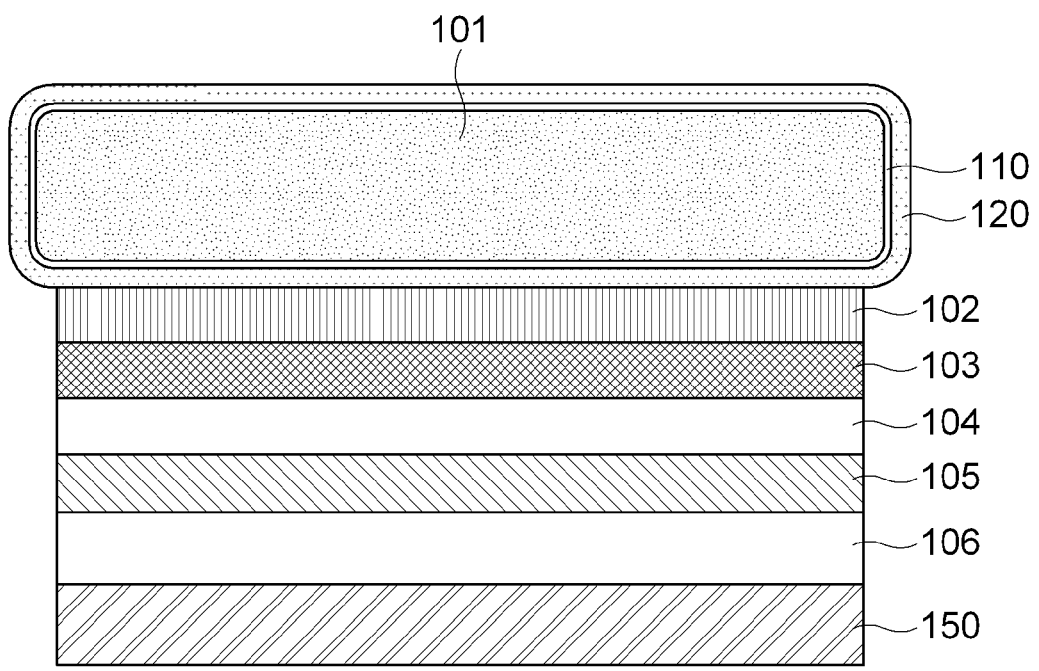

As described above, after preparing the Si—Al substrate 101 having the protection layer 120 on the surface, as shown in FIG. 6, the Si—Al substrate 101 having the protection layer 120 on the surface is bonded to the reflective metal layer 103 by using a bonding metal layer 102.

Herein, although the Si—Al substrate 101 is bonded by using the bonding metal layer 102 as described above, the Si—Al substrate 101 having the protection layer 120 on the surface may be directly bonded to the reflective metal layer 103 without the bonding metal layer 102.

Figure 7:
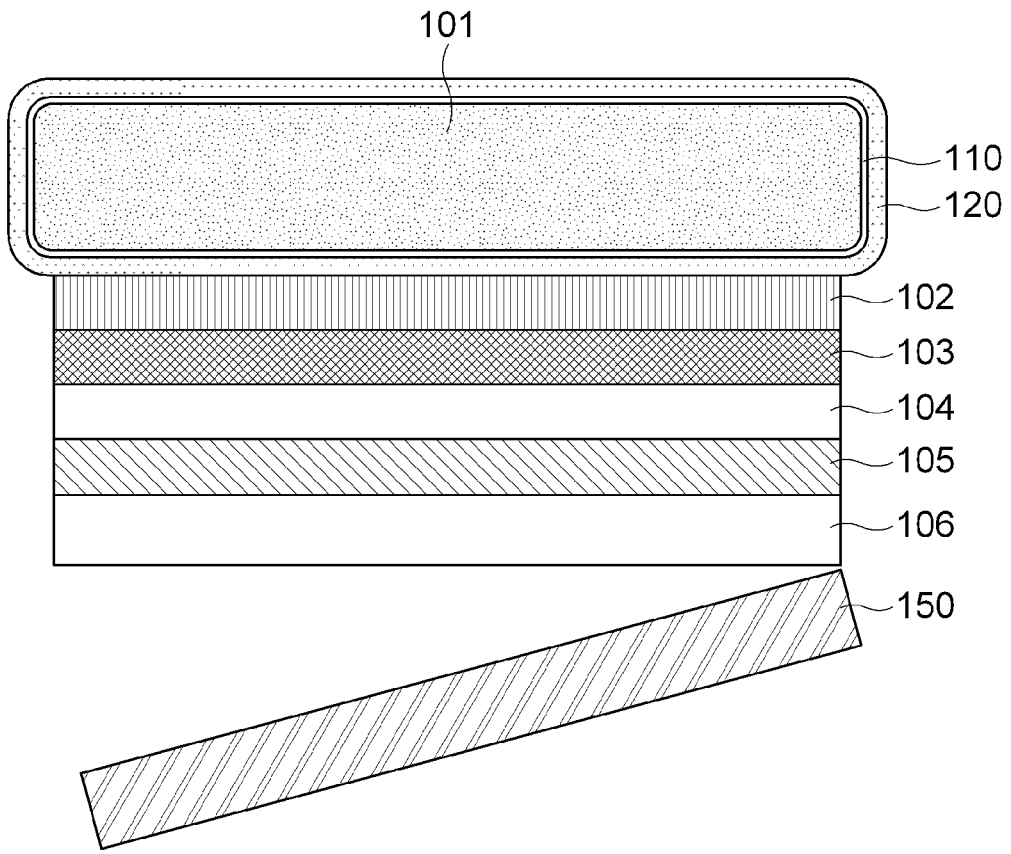

Thereafter, as shown in FIG. 7, the sapphire substrate 150 is separated from the n-type semiconductor layer 106 through an LLO(Laser Lift Off) process. After separating the sapphire substrate 150, a cleaning process may be performed using chemicals such as HCl, HF, and KOH.

Figure 8:
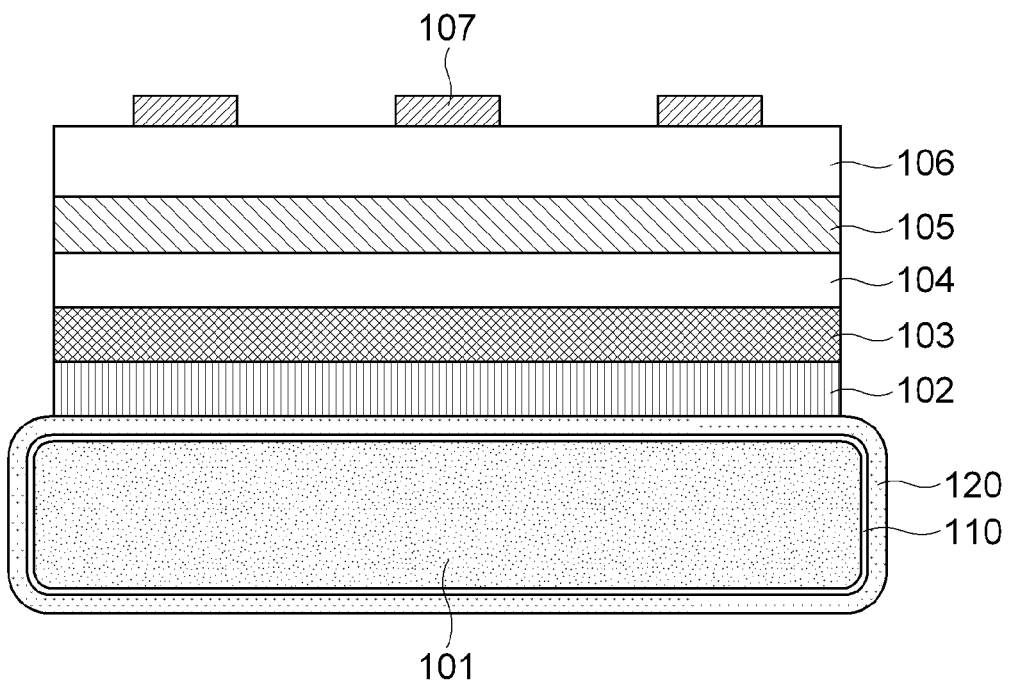

Thereafter, as shown in FIG. 8, a plurality of n-side electrodes 107 are formed on the n-type semiconductor layer 106 which is exposed by separating the sapphire substrate 150.

Herein, before forming the n-side electrodes 107, a texturing process using KOH or the like may be performed on the surface of the n-type semiconductor layer 106 in order to enhance light extraction efficiency of the device.

Figure 9:
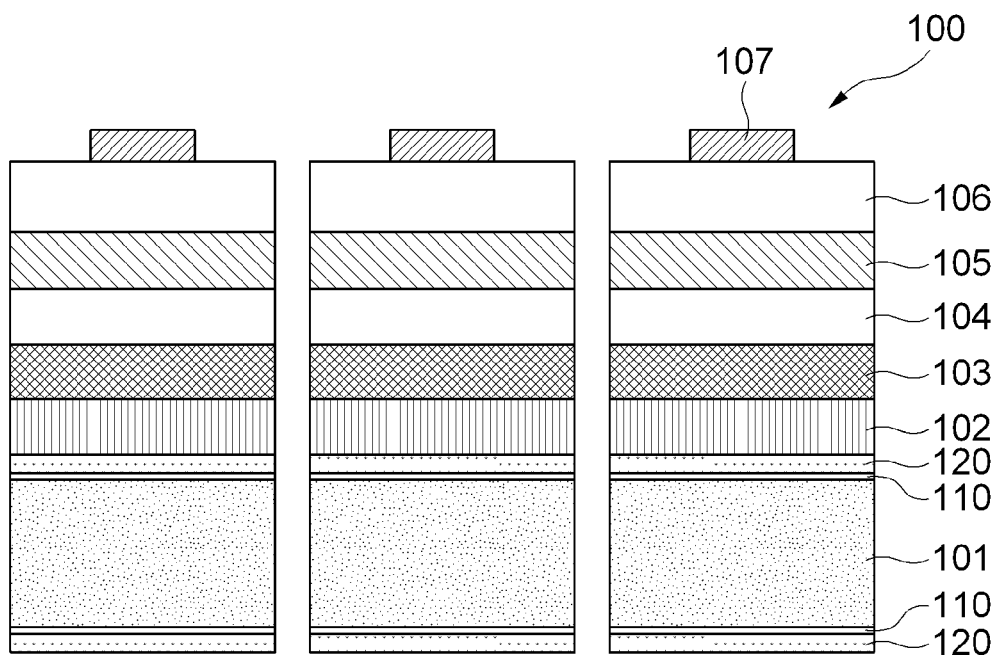

Thereafter, as shown in FIG. 9, the n-type semiconductor layer 106, the active layer 105, the p-type semiconductor layer 104, the reflective metal layer 103, the bonding metal layer 102, the protection layer 120, the seed metal layer 110 and the Si—Al substrate 101 between the n-side electrodes 107 are diced to be divided into chip units. Consequently, it is possible to obtain the compound semiconductor light emitting device 100 in accordance with the first embodiment of the present invention.

As described above, in accordance with the first embodiment of the present invention, it is possible to prevent Al of the Si—Al substrate 101 from being etched due to the chemicals used in the cleaning process performed after separating the sapphire substrate 150, e.g., HCl, HF and KOH, or KOH used in the texturing process of the surface of the n-type semiconductor layer 106 by additionally forming the protection layer 120 such as Ni on the surface of the Si—Al substrate 101. Therefore, in accordance with the first embodiment of the present invention, it is possible to prevent unevenness from being formed on the surface of the Si—Al substrate 101, thereby preventing the light emitting structure bonded to the Si—Al substrate 101 from peeling off.

Further, in the case when using metal such as Ni for the protection layer 120, surface roughness of the Si—Al substrate 101 can be improved to thereby firmly bond the Si—Al substrate 101 and the light emitting structure.

That is, according to the related art, as the Si—Al substrate 101 passes through a cleaning process using chemicals such as acid to remove a native oxide film before forming the bonding metal layer 102, the Al of the surface of the Si—Al substrate 101 is etched and surface unevenness of average 200 to 500 nm is formed at the same time, while, in accordance with the first embodiment of the present invention, if Ni CMP(Chemical Mechanical Polishing) is performed after forming the metal such as Ni as the protection layer 120 on the surface of the Si—Al substrate 101, the surface unevenness is reduced below 5 nm, thereby improving the surface roughness like a mirror surface.

Therefore, since the surface roughness of the Si—Al substrate 101 can be improved, it is possible to firmly bond the Si—Al substrate and the light emitting structure and enhance bonding yield.

<Second Embodiment>

Structure of a Compound Semiconductor Light Emitting Device in Accordance with a Second Embodiment A compound semiconductor light emitting device in accordance with a second embodiment of the present invention will be described in detail with reference to FIG. 10. The same configuration of the second embodiment as that of the first embodiment will be omitted and only different configuration of the second embodiment will be described in detail.

Figure 10:
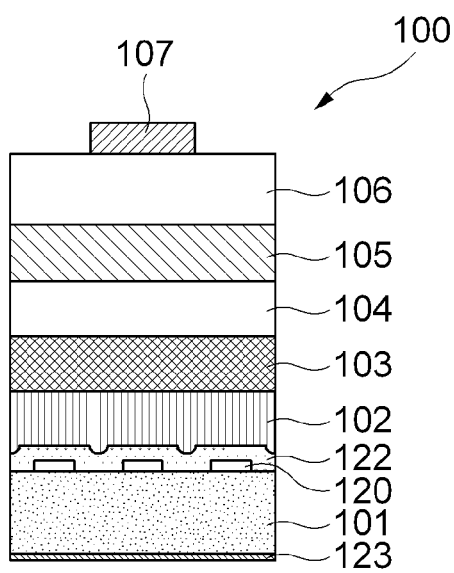
FIG. 10 is a cross-sectional view showing a structure of a compound semiconductor light emitting device in accordance with a second embodiment of the present invention.

FIG. 10 is a cross-sectional view showing a structure of a compound semiconductor light emitting device in accordance with a second embodiment of the present invention.

As shown in FIG. 10, the compound semiconductor light emitting device 100 in accordance with the second embodiment of the present invention includes most of the same components as those of the compound semiconductor light emitting device of the first embodiment, only it is different from the compound semiconductor light emitting device of the first embodiment in that a protection layer 120 is not formed on both top and bottom surfaces of the Si—Al substrate 101 but on the top surface of the Si—Al substrate 101 to expose a portion of the Si—Al substrate 101, a conductive layer 122 is additionally formed on the protection layer 120 and the top surface of the Si—Al substrate 101 exposed by the protection layer 120, and a contact metal layer 123 is formed on the bottom surface of the Si—Al substrate 101.

Particularly, in the compound semiconductor light emitting device in accordance with the second embodiment of the present invention, it is preferable that the protection layer 120 is formed of an insulator instead of metal or conductive dielectric.

That is, in the compound semiconductor light emitting device in accordance with the second embodiment of the present invention, the protection layer 120 is formed of the insulator instead of metal or conductive dielectric, while the protection layer 120 is formed to expose a portion of the top surface of the Si—Al substrate 101 and the conductive layer 122 is additionally formed on the top surface of the Si—Al substrate including the protection layer 120 for conduction between the Si—Al substrate 101 including the protection layer 120 and a light emitting structure positioned at an upper part of the protection layer 120.

Herein, the conductive layer 122 may be formed of metal or the like.

Method for Manufacturing a Compound Semiconductor Light Emitting Device in Accordance with the Second Embodiment Hereinafter, a method for manufacturing a semiconductor light emitting device in accordance with the second embodiment of the present invention will be described in detail. The same configuration of the second embodiment as that of the first embodiment will be omitted and only different configuration of the second embodiment will be described in detail.

First, as shown in FIGS. 2 to 4, an n-type semiconductor layer 106, an active layer 105, a p-type semiconductor layer 104, and a reflective metal layer 103 are formed on a sapphire substrate 150 in order. Herein, the reflective metal layer 103 may not be formed if necessary.

Figure 11:
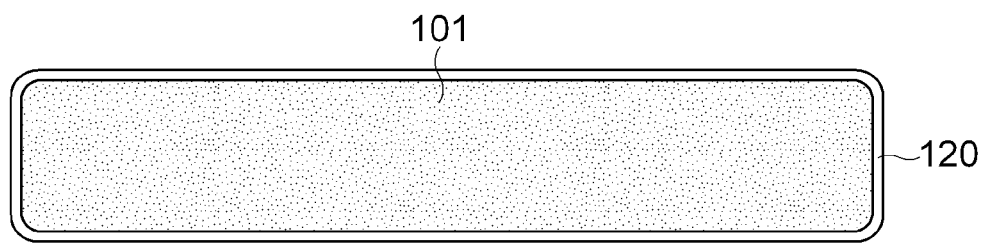
FIGS. 11 to 19 are cross-sectional views sequentially illustrating processes of a method for manufacturing a compound semiconductor light emitting device in accordance with the second embodiment of the present invention.

Thereafter, as shown in FIG. 11, a protection layer 120 is formed on the entire surface of an Si—Al substrate 101.

Herein, the protection layer 120 may be formed of an insulator. The protection layer 120 formed of the insulator may be formed at a thickness of 0.01 μm or more and 1 μm or less by a method such as CVD(Chemical Vapor Deposition) or coating.

At this time, although not shown in the drawings, after forming the protection layer 120, CMP(Chemical Mechanical Polishing) may be performed on the surface of the protection layer 120.

Figure 12:
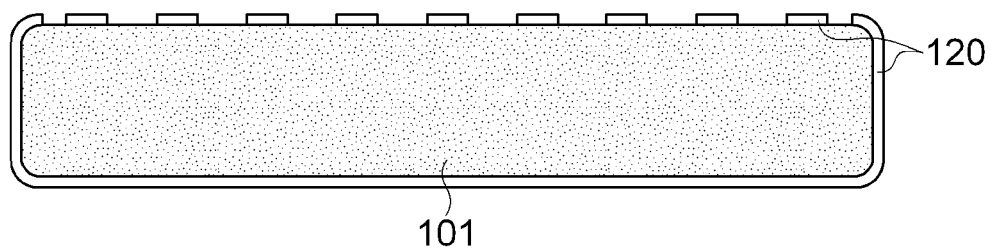

Thereafter, as shown in FIG. 12, a portion of the protection layer 120 is removed by a method such as etching to expose a portion of a top surface of the Si—Al substrate 101.

Figure 13:
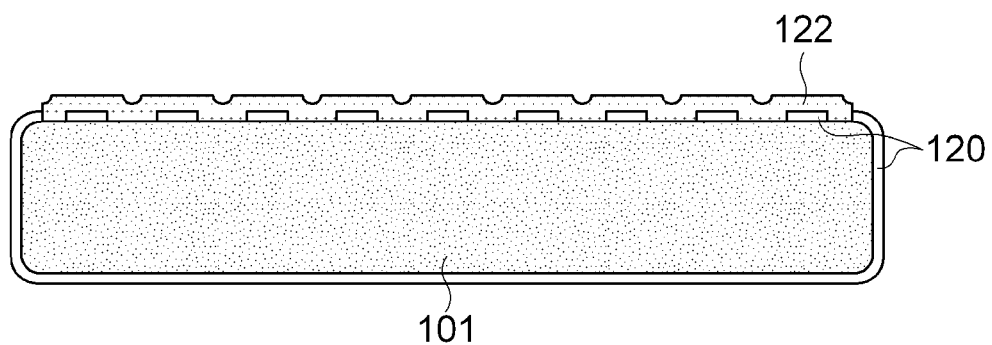

Thereafter, as shown in FIG. 13, a conductive layer 122 is formed on the top surface of the Si—Al substrate 101 including the protection layer 120.

Figure 14:
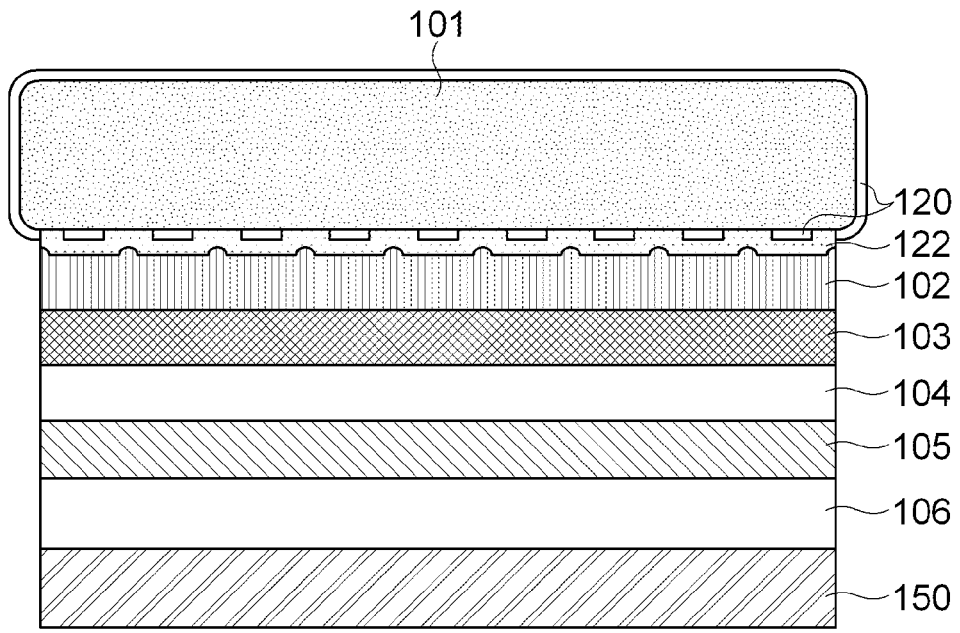

Thereafter, as shown in FIG. 14, the conductive layer 122 formed on the top surface of the Si—Al substrate 101 is bonded to the reflective metal layer 103 by using a bonding metal layer 102.

Figure 15:
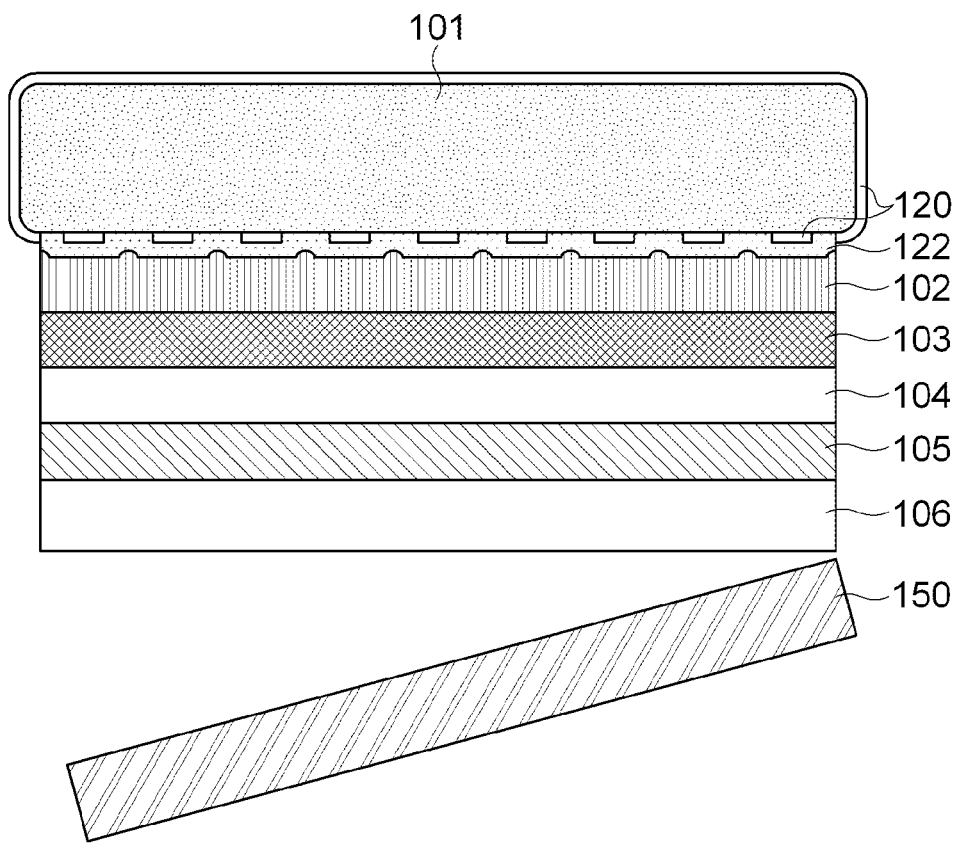

Thereafter, as shown in FIG. 15, the sapphire substrate 150 is separated from the n-type semiconductor layer 106 through an LLO(Laser Lift Off) process.

Herein, after separating the sapphire substrate 150, a cleaning process may be performed using chemicals such as HCl, HF, and KOH. At this time, in accordance with the second embodiment of the present invention, since the protection layer 120 and the conductive layer 120 are formed on the surface of the Si—Al substrate 101, it is possible to prevent Al of the Si—Al substrate 101 from being etched due to the chemicals used in the cleaning process.

Figure 16:
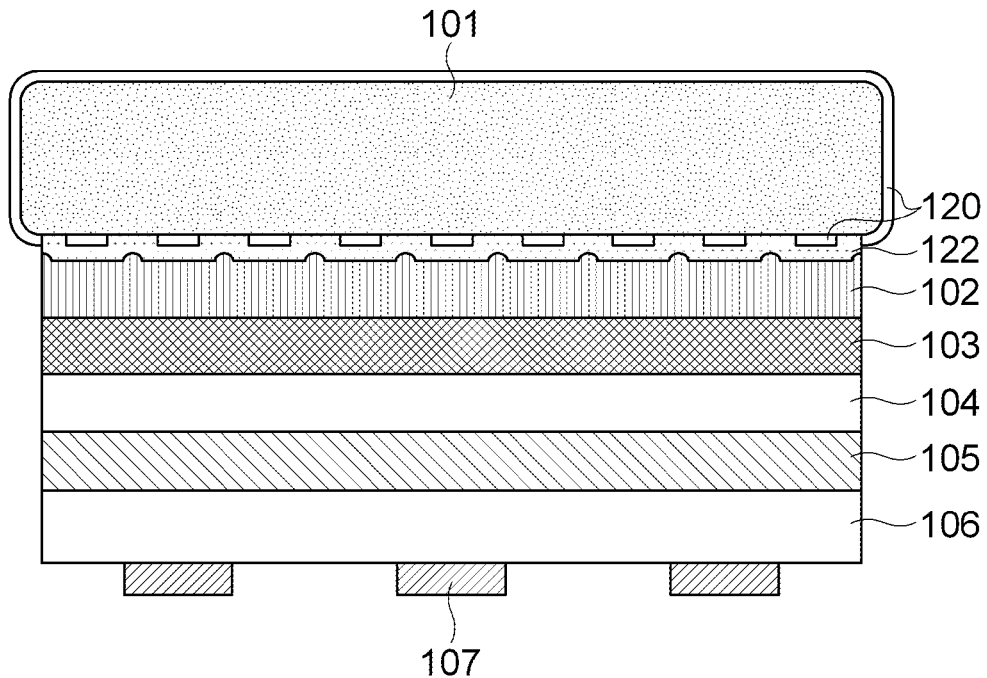

Thereafter, as shown in FIG. 16, a plurality of n-side electrodes 107 are formed on the n-type semiconductor layer 106 which is exposed by separating the sapphire substrate 150.

Herein, before forming the n-side electrodes 107, a texturing process using KOH or the like may be performed on the surface of the n-type semiconductor layer 106 in order to enhance light extraction efficiency of the device. At this time, in accordance with the present embodiment, since the protection layer 120 and the conductive layer 122 are formed on the surface of the Si—Al substrate 101, it is possible to prevent Al of the Si—Al substrate 101 from being etched due to the chemicals used in the texturing process.

Figure 17:
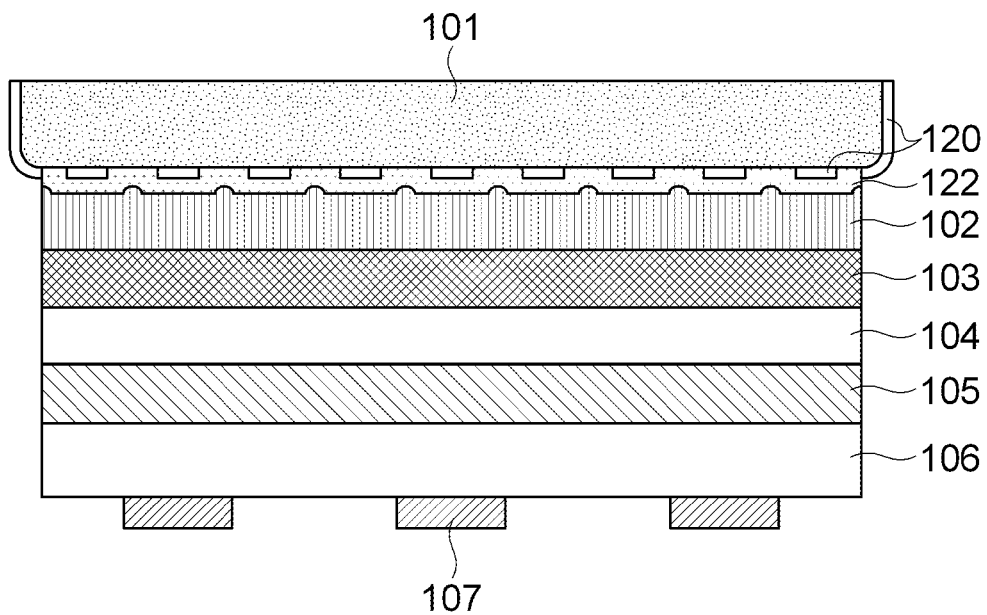

Thereafter, as shown in FIG. 17, a bottom surface of the Si—Al substrate 101 including the protection layer 120 is removed at a predetermined thickness by performing a lapping process.

Figure 18:
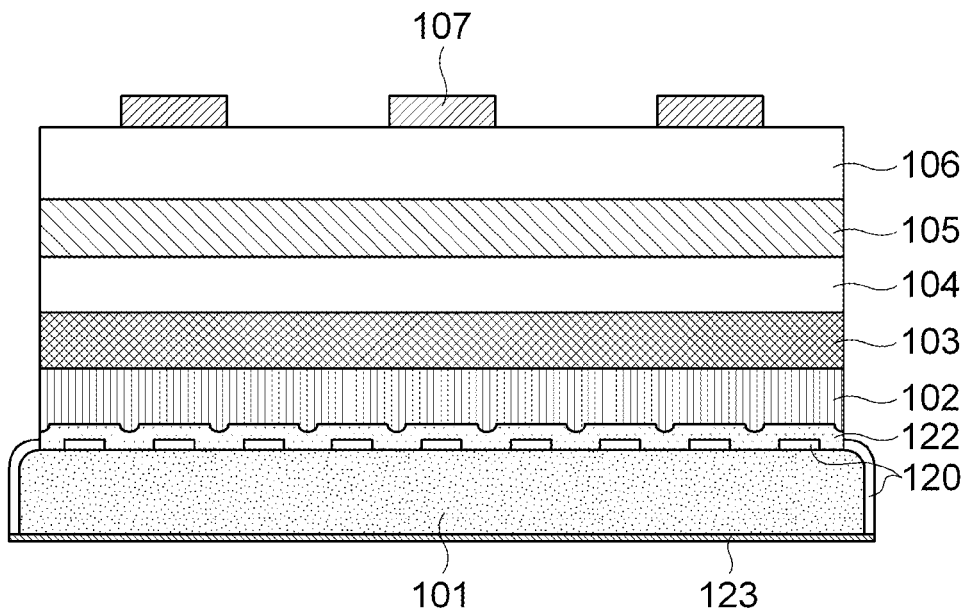

Thereafter, as shown in FIG. 18, a contact metal layer 123 is formed on the bottom surface of the Si—Al substrate 101 exposed through the lapping process.

Figure 19:
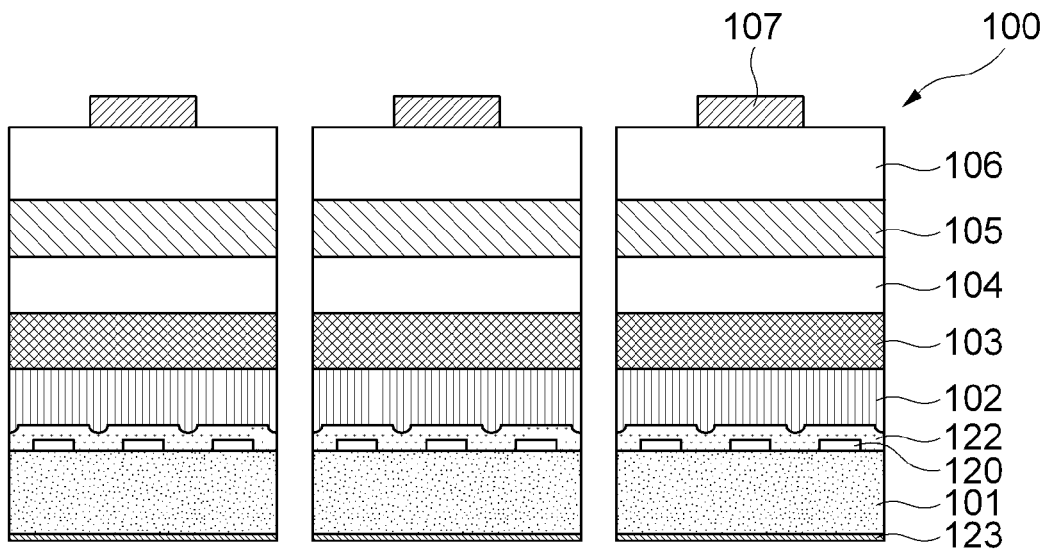

Thereafter, as shown in FIG. 19, the n-type semiconductor layer 106, the active layer 105, the p-type semiconductor layer 104, the reflective metal layer 103, the bonding metal layer 102, the conductive layer 122, the protection layer 120, the Si—Al substrate 101, and the contact metal layer 123 between the n-side electrodes 107 are diced to be divided into chip units. Consequently, it is possible to obtain the compound semiconductor light emitting device 100 in accordance with the second embodiment of the present invention.

The method for manufacturing the compound semiconductor light emitting device in accordance with the second embodiment of the present invention can obtain the same operation and effect as those of the first embodiment.

As described above, the compound semiconductor light emitting device and the method for manufacturing the same in accordance with the present invention can prevent Al of the Si—Al substrate from being etched due to the chemicals by additionally forming the protection layer on the surface of the Si—Al substrate to prevent the attack of chemicals such as acid and alkali. Therefore, it is possible to prevent the unevenness from being formed on the surface of the Si—Al substrate to thereby prevent the light emitting structure bonded to the Si—Al substrate from peeling off.

Further, in the case when using the metal for the protection layer formed on the surface of the Si—Al substrate, the surface roughness can be improved through the protection layer formed of metal. Therefore, it is possible to firmly bond the Si—Al substrate and the light emitting structure and enhance the bonding yield.

As described above, although the preferable embodiments of the present invention have been shown and described, it will be appreciated by those skilled in the art that substitutions, modifications and variations may be made in these embodiments without departing from the principles and spirit of the general inventive concept, the scope of which is defined in the appended claims and their equivalents.

What is claimed is:

1. A method for manufacturing a compound semiconductor light emitting device comprising the steps of:
   sequentially forming an n-type semiconductor layer, an active layer, and a p-type semiconductor layer on a top surface of a growth substrate;
   preparing an Si—Al substrate having a protection layer on a surface of the Si—Al substrate by forming the protection layer on bottom and top surfaces of the Si—Al substrate;
   bonding the Si—Al substrate including the protection layer on the surface of the Si—Al substrate to the p-type semiconductor layer;
   separating the growth substrate from the n-type semiconductor layer;
   forming a plurality of n-side electrodes on the n-type semiconductor layer; and
   dicing the n-type semiconductor layer, the active layer, the p-type semiconductor layer, the protection layer, and the Si—Al substrate between the n-side electrodes to be divided into chip units.

2. The method of claim 1, wherein the protection layer is formed on the surface of the Si—Al substrate at a thickness of 0.01 μm or more and 20 μm or less.

3. The method of claim 1, further comprising a step of:
   performing CMP (Chemical Mechanical Polishing) on a surface of the protection layer after the step of preparing the Si—Al substrate including the protection layer on the surface of the Si—Al substrate.

4. The method of claim 1, wherein the step of bonding the Si—Al substrate including the protection layer on the surface of the Si—Al substrate is performed by directly bonding the Si—Al substrate including the protection layer on a surface to the p-type semiconductor layer.

5. The method of claim 1, wherein the step of bonding the Si—Al substrate including the protection layer on the surface of the Si—Al substrate is performed by bonding the Si—Al substrate including the protection layer on the surface of the Si—Al substrate to the p-type semiconductor layer by using a bonding metal layer.

6. The method of claim 1, further comprising a step of:
forming a reflective metal layer on the p-type semiconductor layer after the step of forming the p-type semiconductor layer.

7. The method of claim 1, wherein the protection layer is formed by using metal or conductive dielectric in the step of preparing the Si—Al substrate including the protection layer on the surface of the Si—Al substrate.

8. The method of claim 7, wherein:
the protection layer is formed of the metal, and
the metal is formed by any one of electroless plating, metal deposition, sputtering and CVD (Chemical Vapor Deposition).

9. The method of claim 7, wherein:
the protection layer is formed of the conductive dielectric, and
the conductive dielectric is formed by deposition or sputtering.

10. A method for manufacturing a compound semiconductor light emitting device comprising the steps of:
sequentially forming an n-type semiconductor layer, an active layer, and a p-type semiconductor layer on a growth substrate;
preparing an Si—Al substrate including a protection layer on portions other than a particular portion of a top surface of the Si—Al substrate by forming the protection layer on the portions other than the particular portion of the top surface of the Si—Al substrate;
forming a conductive layer on the top surface of the Si—Al substrate including the protection layer;
bonding the conductive layer formed on the top surface of the Si—Al substrate to the p-type semiconductor layer;
separating the growth substrate from the n-type semiconductor layer;
forming a plurality of n-side electrodes on the n-type semiconductor layer;
lapping a bottom surface of the Si—Al substrate including the protection layer;
forming a contact metal layer on the bottom surface of the Si—Al substrate; and
dicing the n-type semiconductor layer, the active layer, the p-type semiconductor layer, the conductive layer, the protection layer, the Si—Al substrate, and the contact metal layer between the n-side electrodes to be divided into chip units.

11. The method of claim 10, wherein the step of preparing the Si—Al substrate including the protection layer on the portions other than the particular portion of the top surface includes steps of:
forming the protection layer on the entire surface of the Si—Al substrate; and
exposing the particular portion of the top surface of the Si—Al substrate by removing a portion of the protection layer.

12. The method of claim 11, wherein the protection layer is formed by using an insulator in the step of forming the protection layer on the entire surface of the Si—Al substrate.

\* \* \* \* \*